(12) United States Patent
Luo

(10) Patent No.: US 11,482,693 B2
(45) Date of Patent: Oct. 25, 2022

(54) ELECTROLUMINESCENT DEVICE INCLUDING COLOR RENDERING MATERIALS

(71) Applicant: BOE TECHNOLOGY GROUP CO., LTD., Beijing (CN)

(72) Inventor: Chengyuan Luo, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/043,881

(22) PCT Filed: Apr. 14, 2020

(86) PCT No.: PCT/CN2020/084682
§ 371 (c)(1),
(2) Date: Sep. 30, 2020

(87) PCT Pub. No.: WO2020/224393
PCT Pub. Date: Nov. 12, 2020

(65) Prior Publication Data
US 2021/0367208 A1 Nov. 25, 2021

(30) Foreign Application Priority Data
May 7, 2019 (CN) .......................... 201910374136.1

(51) Int. Cl.
*H01L 51/00* (2006.01)
*H01L 51/50* (2006.01)
(Continued)

(52) U.S. Cl.
CPC ...... *H01L 51/5253* (2013.01); *H01L 51/0097* (2013.01); *H01L 51/5036* (2013.01);
(Continued)

(58) Field of Classification Search
CPC ............. H01L 51/5253; H01L 51/0097; H01L 51/5036; H01L 51/5256; H01L 51/5246;
(Continued)

(56) References Cited

U.S. PATENT DOCUMENTS 6,970,219 B1 * 11/2005 Hermann ............ H01L 51/5253
349/1
10,483,490 B2    11/2019 Wang et al.
(Continued)

FOREIGN PATENT DOCUMENTS

CN     104821376 A    8/2015
CN     105280675 A    1/2016
(Continued)

OTHER PUBLICATIONS

International Search Report and Written Opinion for International Application No. PCT/CN2020/084682 dated Jul. 15, 2020.
(Continued)

*Primary Examiner* — Ida M Soward
(74) *Attorney, Agent, or Firm* — Perilla Knox & Hildebrandt LLP; Kenneth A. Knox

(57) ABSTRACT

An electroluminescent device, includes: a base substrate; a light emitting unit provided on the base substrate; a first accommodating structure surrounding the light emitting unit and provided on the base substrate; a first color rendering material filled in the first accommodating structure; a first inorganic thin film encapsulation layer covering the light emitting unit and the first color rendering material; a second accommodating structure provided on one side of the first inorganic thin film encapsulation layer distal to the first color rendering material; a second color rendering material filled in the second accommodating structure; and a second inorganic thin film encapsulation layer sealing the second color rendering material in the second accommodating structure;
(Continued)

wherein the first color rendering material and the second color rendering material are capable of producing a color development reaction after mixture.

13 Claims, 3 Drawing Sheets

(51) Int. Cl.
| | | |
|---|---|---|
| H01L 51/52 | (2006.01) | |
| H01L 27/32 | (2006.01) | |
| H01L 23/26 | (2006.01) | |
| H01L 23/28 | (2006.01) | |
| H01L 23/00 | (2006.01) | |

(52) U.S. Cl.
CPC .............. *H01L 23/26* (2013.01); *H01L 23/28* (2013.01); *H01L 23/562* (2013.01); *H01L 23/564* (2013.01); *H01L 51/0096* (2013.01); *H01L 2251/301* (2013.01)

(58) Field of Classification Search
CPC ........... H01L 51/0096; H01L 2251/301; H01L 2251/5338; H01L 27/322; H01L 27/3246; H01L 27/3272; H01L 23/562; H01L 23/564; H01L 23/26; H01L 23/28
See application file for complete search history.

(56) References Cited

U.S. PATENT DOCUMENTS

| | | | | | |
|---|---|---|---|---|---|
| 2008/0238295 | A1* | 10/2008 | Takei | ...................... | H01L 51/52 313/499 |
| 2016/0380238 | A1* | 12/2016 | Ma | ........................ | H01L 27/322 257/40 |
| 2017/0084676 | A1* | 3/2017 | Jang | ...................... | H01L 27/326 |
| 2017/0141163 | A1* | 5/2017 | Xiong | .................. | G09G 3/3258 |
| 2018/0190938 | A1 | 7/2018 | Wang et al. | | |
| 2018/0287099 | A1* | 10/2018 | Uchida | .................. | H05B 33/24 |
| 2018/0323404 | A1* | 11/2018 | Inoue | .................. | H01L 27/3248 |
| 2019/0267557 | A1* | 8/2019 | Zhao | .................... | H01L 51/5253 |
| 2020/0064968 | A1* | 2/2020 | Kim | ....................... | H01L 27/323 |
| 2020/0106045 | A1* | 4/2020 | Han | .................... | H01L 27/3234 |
| 2020/0110495 | A1* | 4/2020 | Han | .................... | G06F 3/0443 |
| 2020/0119304 | A1* | 4/2020 | Choi | .................... | H01L 51/5237 |
| 2020/0127216 | A1* | 4/2020 | Tao | .................... | H01L 51/5253 |
| 2021/0151715 | A1* | 5/2021 | Lee | .................... | H01L 27/3258 |
| 2022/0005878 | A1* | 1/2022 | Lee | .................... | G06F 3/04164 |

FOREIGN PATENT DOCUMENTS

| | | |
|---|---|---|
| CN | 105679961 A | 6/2016 |
| CN | 105895827 A | 8/2016 |
| CN | 106298571 A | 1/2017 |
| CN | 107068908 A | 8/2017 |
| CN | 106298571 B | 10/2017 |
| CN | 107068908 B | 9/2018 |
| CN | 108520895 A | 9/2018 |
| CN | 108899437 A | 11/2018 |
| CN | 109256489 A | 1/2019 |
| CN | 110098234 A | 8/2019 |
| JP | F10267866 A | 10/1998 |
| TW | 201939144 A | 10/2019 |
| TW | I673556 B | 10/2019 |

OTHER PUBLICATIONS

First Office Action for CN Patent Application No. 201910374136.1 dated Oct. 10, 2020.

\* cited by examiner

ELECTROLUMINESCENT DEVICE INCLUDING COLOR RENDERING MATERIALS

CROSS-REFERENCE TO RELATED APPLICATIONS

The present application is based on International Application No. PCT/CN2020/084682 filed on Apr. 14, 2020, which is based upon and claims priority to Chinese Patent Application No. 201910374136.1 filed on May 7, 2019, the entire contents of which are incorporated herein by reference.

TECHNICAL FIELD

The present disclosure belongs to the field of display technology and, more particularly, to an electroluminescent device, a method for manufacturing the same, a method for detecting the same, and a display device.

BACKGROUND

Organic light emitting diodes (OLEDs) are display and lighting technologies that have attracted much attention in recent years. They have characteristics such as rich color gamut, high contrast, flexibility, and ultra-thinness, and are regarded as the next-generation display technologies. Especially flexible display, deformation and bendability can better reflect the advantages of the OLEDs.

A flexible OLED substrate needs to be cut after the packaging is completed, to form individual separate display panels. At present, laser cutting is generally used to produce panels due to its high flexibility, a high cutting speed, high production efficiency, and a short production cycle. However, since high temperature will be generated locally upon laser cutting, there will be a crack occurring in a thin-film encapsulation inorganic layer at the edge of a flexible substrate due to instantaneous thermal expansion and contraction and external moisture will penetrate inward along the crack, thus disabling a flexible electroluminescent device. Although a series of measures are taken in the current technology to reduce the internal extension of cracks, it is difficult to completely avoid the situation. Since the penetration of moisture is a very slow process, it is difficult to intuitively find the extended cracks through quality inspection when screens are produced, so that their quality at the time of shipment cannot be guaranteed.

It should be noted that information disclosed in this part are provided only for acquiring a better understanding of the background of the present application and, therefore, may include information that is not current technology already known to those of ordinary skill in the art.

SUMMARY

According to one aspect of the present disclosure, there is provided an electroluminescent device, comprising: a base substrate; a light emitting unit provided on the base substrate; a first accommodating structure surrounding the light emitting unit and provided on the base substrate; a first color rendering material filled in the first accommodating structure; a first inorganic thin film encapsulation layer covering the light emitting unit and the first color rendering material; a second accommodating structure provided on one side of the first inorganic thin film encapsulation layer distal to the first color rendering material; a second color rendering material filled in the second accommodating structure; and a second inorganic thin film encapsulation layer sealing the second color rendering material in the second accommodating structure; wherein the first color rendering material and the second color rendering material are capable of producing a color development reaction after mixture.

According to another embodiment of the present disclosure, an orthographic projection of the second accommodating structure on the base substrate overlaps an orthographic projection of the first accommodating structure on the base substrate.

According to another embodiment of the present disclosure, the first accommodating structure is a groove opened on the base substrate.

According to another embodiment of the present disclosure, the first accommodating structure is formed by a retaining wall provided on the base substrate.

According to another embodiment of the present disclosure, an edge inflection point of the first accommodating structure has a smooth surface.

According to another embodiment of the present disclosure, one of the first color rendering material and the second color rendering material comprises a colorless dyestuff/ leuco dye while the other of the first color rendering material and the second color rendering material comprises a chromogenic agent.

According to another embodiment of the present disclosure, the colorless dyestuff/leuco dye is selected from one or more of crystal violet lactone, fluorane dyes, BLMB or spiropyran dye; and the chromogenic agent is selected from one or more of para-hydroxybenzoic acid and para-hydroxybenzoic acid esters, salicylic acid, 2,4-dihydroxybenzoic acid or aromatic sulfone.

According to another embodiment of the present disclosure, the base substrate is made of a flexible material.

According to another aspect of the present disclosure, there is further provided a method for manufacturing an electroluminescent device, comprising: forming, on a base substrate provided with a light emitting unit, a first accommodating structure surrounding the light emitting unit; filling a first color rendering material in the first accommodating structure; forming a first inorganic thin film encapsulation layer to cover the light emitting unit and the first color rendering material, and forming a second accommodating structure on one side of the first inorganic thin film encapsulation layer distal to the first color rendering material; filling a second color rendering material in the second accommodating structure; forming a second inorganic thin film encapsulation layer to seal the second accommodating structure; wherein the first color rendering material and the second color rendering material are capable of producing a color development reaction after mixture.

According to another embodiment of the present disclosure, an orthographic projection of the second accommodating structure on the base substrate overlaps an orthographic projection of the first accommodating structure on the base substrate.

According to still another aspect of the present disclosure, there is further provided a method for detecting an electroluminescent device, comprising: forming, on a base substrate provided with a light emitting unit, a first accommodating structure surrounding the light emitting unit; filling a first color rendering material in the first accommodating structure; forming a first inorganic thin film encapsulation layer to cover the light emitting unit and the first color rendering material, and forming a second accommodating structure on one side of the first inorganic thin film encapsulation layer distal to the first color rendering material, wherein an orthographic projection of the second accommodating structure on the base substrate overlaps an orthographic projection of the first accommodating structure on the base substrate; filling a second color rendering material in the second accommodating structure; forming a second inorganic thin film encapsulation layer to seal the second accommodating structure, wherein the first color rendering material and the second color rendering material are capable of producing a color development reaction after mixture; and detecting whether there is a color change in the first accommodating structure and the second accommodating structure after the base substrate is cut, and if there is a color change, indicating that there is a crack in the first inorganic thin film encapsulation layer.

According to another embodiment of the present disclosure, an orthographic projection of the second accommodating structure on the base substrate overlaps an orthographic projection of the first accommodating structure on the base substrate.

According to another embodiment of the present disclosure, conditions under which the first color rendering material and the second color rendering material produce a color development reaction are provided for the first accommodating structure and the second accommodating structure before detecting whether there is color development in the first accommodating structure and the second accommodating structure.

According to an embodiment of the present disclosure, conditions under which the first color rendering material and the second color rendering material produce a color development reaction are provided for the accommodating structure before detecting whether there is color development in the accommodating structure.

According to still yet another aspect of the present disclosure, there is further provided a display device, comprising the above-mentioned electroluminescent device.

BRIEF DESCRIPTION OF THE DRAWINGS

The above-mentioned and other features and advantages of the present disclosure will become more apparent by describing exemplary embodiments thereof in detail with reference to the accompanying drawings.

DETAILED DESCRIPTION

Figure 1:
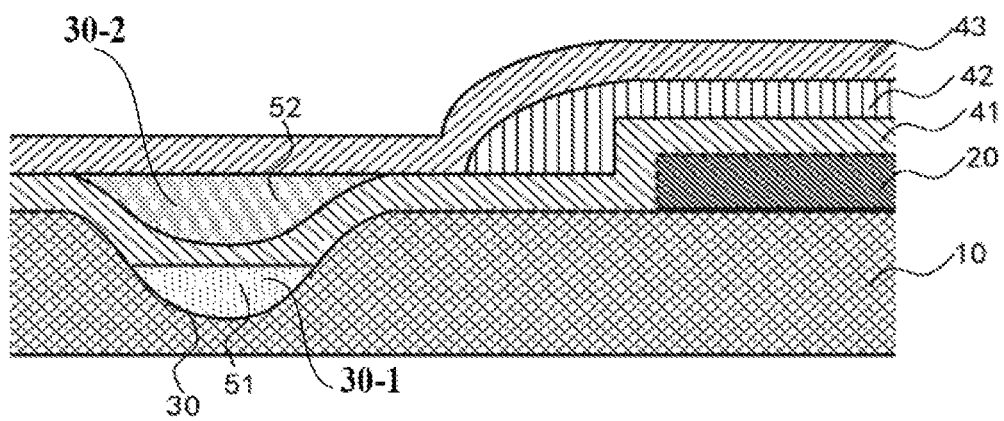
FIG. 1 is a schematic diagram illustrating an electroluminescent device according to an embodiment of the present disclosure.

Exemplary embodiments will now be described more fully by reference to the accompanying drawings. However, the exemplary embodiments can be implemented in various forms and should not be understood as being limited to the examples set forth herein; rather, the embodiments are provided so that this disclosure will be thorough and complete, and the conception of exemplary embodiments will be fully conveyed to those skilled in the art. In the drawings, for clarity, thicknesses of areas and layers will be exaggerated. The same reference signs in the drawings denote the same or similar structures and detailed description thereof will be omitted.

It should be noted that terms such as "on", "under" herein are only relative concepts or take the normal use state of a product as reference, and should not be considered as restrictive.

Figure 2:
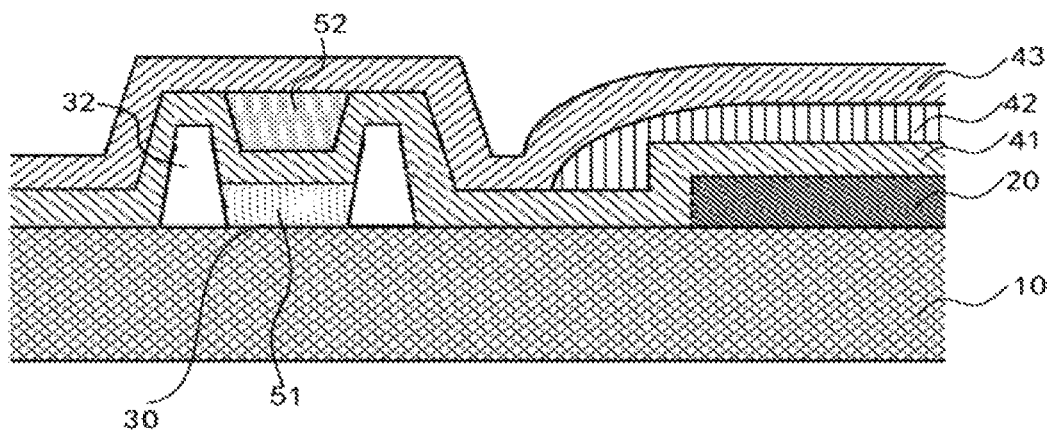
FIG. 2 is a schematic diagram illustrating an electroluminescent device according to another embodiment of the present disclosure.

As shown in FIGS. 1 and 2, an electroluminescent device includes a base substrate 10; a light emitting unit 20; an accommodating structure 30 surrounding the light emitting unit 20, wherein the accommodating structure includes a first accommodating structure 30-1 and a second accommodating structure 30-2, and the first accommodating structure 30-1 is provided on the base substrate 10; a first color rendering material 51 filled in the first accommodating structure 30-1; a first inorganic thin film encapsulation layer 41 covering the light emitting unit 20 and the first color rendering material; wherein the second accommodating structure 30-2 is provided on one side of the first inorganic thin film encapsulation layer distal to the first color rendering material; a second inorganic thin film encapsulation layer 43 sealing a second color rendering material 52 in the second accommodating structure 30-2; wherein the first color rendering material 51 and the second color rendering material 52 produce a color development reaction after mixture. The first accommodating structure 30-1 is located corresponding to the second accommodating structure 30-2. Namely, an orthographic projection of the second accommodating structure on the base substrate overlaps that of the first accommodating structure on the base substrate.

The first accommodating structure 30-1 herein refers to a hermetic space enclosed by the first inorganic thin film encapsulation layer 41 and the lower portion of the accommodating structure 30. Namely, the space filled with the first color rendering material 51 is hereinafter referred to as "a first space". The second accommodating structure 30-2 herein refers to another space of the accommodating structure 30 other than the "first space", which is enclosed by a surface of the first inorganic thin film encapsulation layer 41 distal to the first space and the second inorganic thin film encapsulation layer 43. Namely, the space filled with the second color rendering material 52 is hereinafter referred to as "a second space".

In the electroluminescent device of the present disclosure, after all the encapsulation structures are completed, the electroluminescent device is cut to form a screen and then the accommodating structure 30 is observed with a microscope for example, if there is a color change, it indicates that a crack occurs in the first inorganic thin film encapsulation layer 41. The color change is caused by the mixture of the first color rendering material 51 in the first space and the second color rendering material 52 in the second space through the crack in the first inorganic thin film encapsulation layer 41, so that a color development reaction occurs and there is a color change in the accommodating structure 30. Since the first inorganic thin film encapsulation layer 41 is an encapsulation layer of the light emitting unit 20, if a crack occurs therein, its role of blocking of moisture will be deteriorated, thereby affecting the quality of the device. In the present disclosure, whether there is a crack in the first inorganic thin film encapsulation layer 41 that encapsulates the light emitting unit 20 is determined by determining whether there is a color change in the accommodating structure 30 after cutting. If the crack occurs, the screen will be repaired or scrapped, thereby avoid affecting the product quality of the device. When the accommodating structure 30 is observed, if necessary, corresponding color development reaction conditions (such as heating) may be provided according to the types of the first and second color rendering materials.

The base substrate 10 and the light emitting unit 20 of the electroluminescent device are existing components and will not be described here. The base substrate 10 may be provided with flexibility (for example, polyimide is used as the substrate) to form a flexible electroluminescent device.

As shown in FIG. 1, the accommodating structure 30 may be a groove opened on the base substrate 10. Alternatively, as shown in FIG. 2, a retaining wall 31, which forms the accommodating structure 30, is provided on the base substrate 10. The accommodating structure 30 is provided around the light emitting unit 20, i.e., at a predetermined edge position of the thin film encapsulation layer on the base substrate 10. The preparation process of the electroluminescent device shown in FIGS. 1 and 2 will be described in detail below in conjunction with FIGS. 3 and 4, respectively.

Figure 3:
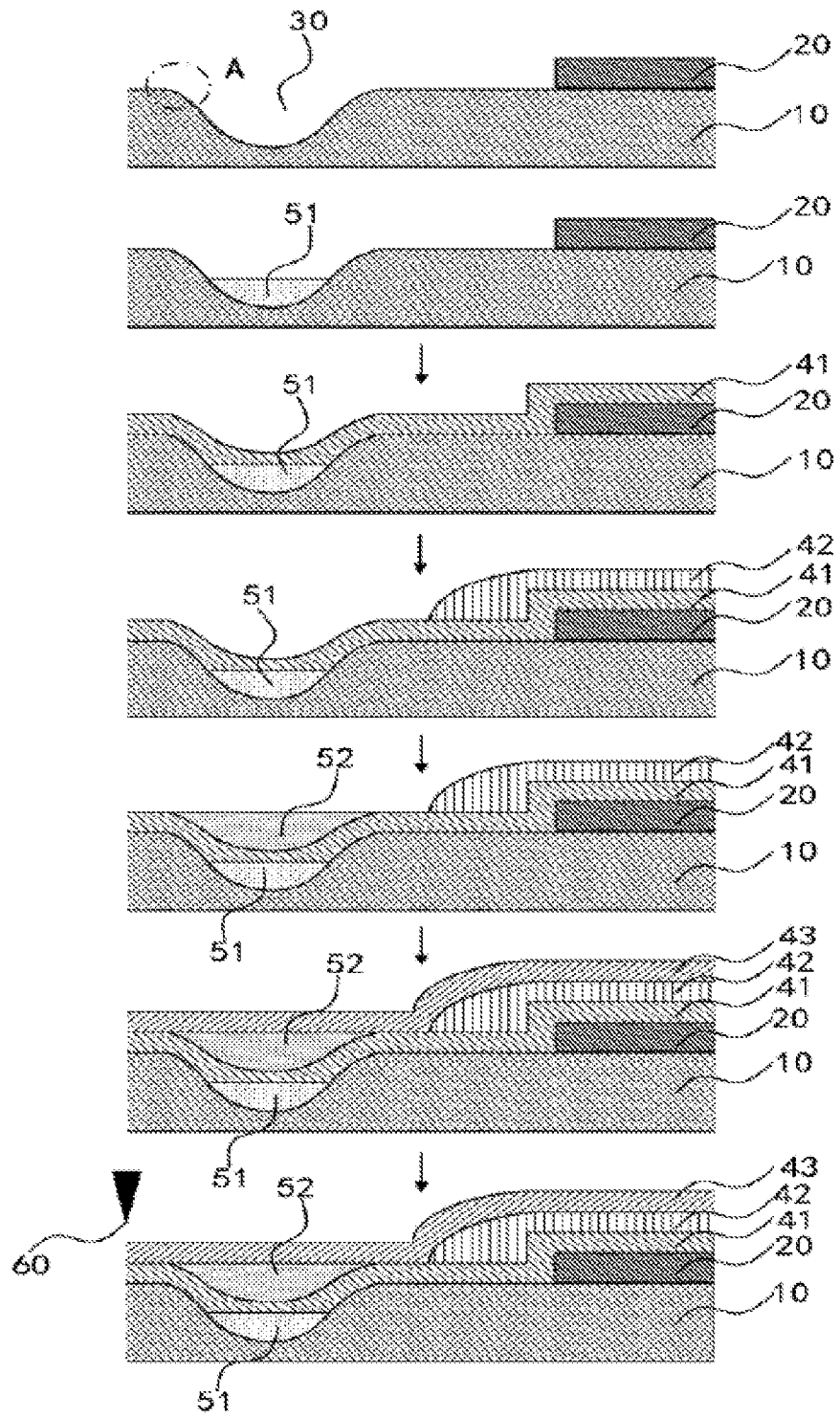
FIG. 3 is a schematic diagram illustrating a formation process of the electroluminescent device shown in FIG. 1.

As shown in FIG. 3, an accommodating structure 30 having a groove is formed on the base substrate 10 provided with the light emitting unit 20. For example, but it is not limited to a groove that is etched with laser, a suitable size of the groove may be selected according to the size of the electroluminescent device. For example, serving as the groove, an arc-shaped groove having a depth of 0.1 mm-0.3 mm and a width of 0.5 mm-1 mm is manufactured by laser etching at the edge position of the thin-film encapsulation layer on the base substrate 10. An edge inflection point of the groove, such as A, is smoothed to form a smooth surface to avoid a small-angle inflection point.

The first color rendering material 51 is filled in a portion of the accommodating structure 30. Then, the first inorganic thin film encapsulation layer 41 is formed to cover the accommodating structure 30 and the light emitting unit 20, and seal the first color rendering material 51 in the lower portion, that is, the first space, of the accommodating structure 30. The edge inflection point A of the groove 31 has a smooth surface to avoid a small-angle inflection point, therefore, the first inorganic thin film encapsulation layer 41 may be prevented from breaking prematurely due to the small-angle inflection point, thus affecting the observation result. The first inorganic thin film encapsulation layer 41 is also one of the thin film encapsulation layers of the light emitting unit. Thereafter, a first organic thin film encapsulation layer 42 for encapsulating the light emitting unit 20 may be formed, and the edge of the layer does not exceed an area enclosed by the accommodating structure 30. After that, the second color rendering material 52 is filled in the accommodating structure 30 to completely fill the accommodating structure 30, that is, the second color rendering material 52 is filled in the second space of the accommodating space except for the first space and the space occupied by the first inorganic thin film encapsulation layer. Then, a second inorganic thin film encapsulation layer 43 is formed, to seal the second color rendering material 52 in the second space. Furthermore, the second inorganic thin film encapsulation layer 43 may also be one of the thin film encapsulation layers of the light emitting unit 20, that is, the second inorganic thin film encapsulation layer 43 covers the first organic thin film encapsulation layer 42. After the completion of the encapsulation, the electroluminescent device is cut at the cutting position 60 to form a screen. Then, whether there is a color change in the accommodating structure 30 is observed to determine whether the cut product is qualified.

Figure 4:
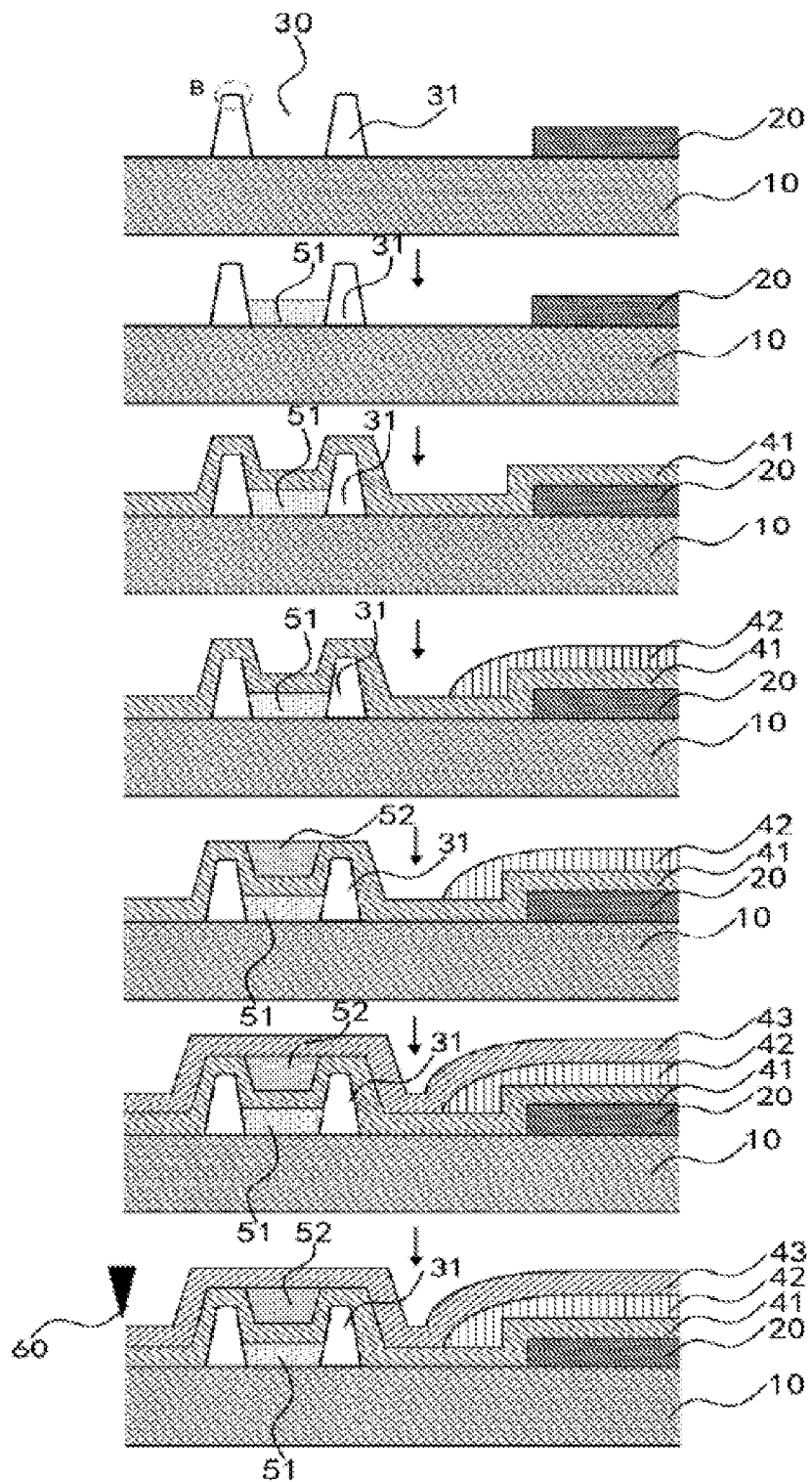
FIG. 4 is a schematic diagram illustrating a formation process of the electroluminescent device shown in FIG. 2.

FIG. 4 is a schematic diagram illustrating an electroluminescent device adopting another accommodating structure 30. As shown in the figure, an accommodating structure 30 having a retaining wall 31 is formed on a base substrate 10 provided with a light emitting unit 20. For example, it is not limited to the retaining wall 31 made of photoresist, however. The retaining wall 31 may be at least two rows of trapezoidal retaining walls 31, which are arranged at intervals of 0.5 mm to 1 mm and have a width of 0.1 mm to 0.5 mm and a height of 0.1 mm to 0.3 mm, are formed by photolithography at the edge position of the thin film encapsulation layer on the base substrate 10. The two rows of retaining walls 31 form the accommodating structure 30. An edge inflection point of the accommodating space, such as B may also be smoothed to form a smooth surface, thus avoiding a small angle inflection point. Therefore, the first inorganic thin film encapsulation layer 41 formed later may be prevented from breaking in advance due to the small-angle inflection point, thus affecting the observation result.

Thereafter, the filling of the first color rendering material 51 in a portion of the accommodating structure 30, the forming of the first inorganic thin-film encapsulation layer 41, the first organic thin-film encapsulation layer 42, the filling of the second color rendering material 52, and the forming of the second inorganic thin-film encapsulation layer 43 are performed in sequence. This process is similar to that shown in FIG. 3, and will not be described in detail here.

Main components of the first color rendering material 51 and the second color rendering material 52 are a colorless dyestuff/leuco dye and a chromogenic agent, respectively. If the main component of the first color rendering material 51 is a colorless dyestuff/leuco dye, the main component of the second color rendering material 52 is a chromogenic agent; on the contrary, if the main component of the second color rendering material 52 is a colorless dyestuff/leuco dye, the main component of the first color rendering material 51 is a color developer. In order to increase the permeability of the color rendering materials in the crack, the color rendering materials may be dissolved in an organic solvent that does not produce any chemical reaction with it. The solvent may be, but not limited to, glycerin, a resin-based liquid carrier. If the color development reaction between the first color rendering material 51 and the second color rendering material 52 needs to proceed under certain conditions, the corresponding reaction conditions may be provided. For example, the first color rendering material 51 and the second color rendering material 52 can produce a color development reaction under the condition of heating, light, or an electromagnetic field after mixture. The reaction conditions may be determined according to the types of color rendering materials, which will not be elaborated here.

The colorless dyestuff/leuco dye may be selected from one or more of crystal violet lactone (CVL), fluorane dyes, BLMB (Bengoyl leuco methylene blue) of trityl phthalide system, or spiropyran system. The chromogenic agent may be selected from one or more of para-hydroxybenzoic acid and para-hydroxybenzoic acid esters (such as PHBB, PHB, etc.), salicylic acid, 2,4-dihydroxybenzoic acid or aromatic sulfone.

The first inorganic thin film encapsulation layer 41 and the second inorganic thin film encapsulation layer 43 may be formed of $SiN_x$, $SiCN$, $SiO_2$, $SiNO$, $Al_2O_3$. It may be formed by chemical vapor deposition (CVD), physical vapor deposition (PVD), atomic force deposition (ALD), and may have a thickness of 0.03 μm-0.5 μm.

A thin film encapsulation structure of the light emitting unit 20 in the electroluminescent device may further include a first organic thin film encapsulation layer 42. The first organic thin film encapsulation layer 42 may be formed of polyethylene, polystyrene, polypropylene, polyacrylic acid, polyacrylate, polyamide, polyimide, polycarbonate, urethane acrylate, polyester, polysiloxane, polysilazane with a thickness of 1 μm-20 μm by spraying, print, printing. The first organic thin film encapsulation layer 42 is not limited to the above-described way of forming, but may be formed in any suitable way. The first organic thin film encapsulation layer 42 should cover the light emitting unit 20 and an area covered by it is smaller than the area enclosed by the accommodating structure 30.

After the electroluminescent device of the present disclosure is formed and cut to form a screen, it is determined whether there is a crack in the first inorganic thin film encapsulation layer 41 by observing whether there is a color change in the accommodating structure 30. If there is a crack in the first inorganic thin film encapsulation layer 41 in the accommodating structure 30, the first color rendering material 51 and the second color rendering material 52 are mixed through the crack, thus producing a color development reaction and resulting in a color change. Therefore, whether there is a crack in the first inorganic thin film encapsulation layer 41 may be determined by observing whether there is a color change in the accommodating structure 30, so that devices with cracks on the edge may be screened out in time, and then repaired or scrapped according to the damage to avoid exerting an influence on the product quality.

Specific embodiments of a structure and a manufacturing method of an electroluminescent device according to an embodiment in the art will be described below in conjunction with FIGS. 1 and 3 to explain the inventive concept of the present disclosure in more detail. Those skilled in the art can understand that a first embodiment is provided only for further explanation of the present disclosure, and is not intended to limit the present disclosure.

An arc-shaped groove having a width of 1 mm and a depth of 0.3 mm is opened at an edge position of a predetermined thin film encapsulation layer on a base substrate 10, and is smoothly transited, and then a mixture of CVL and glycerin is sprayed as the first color rendering material 51 in the accommodating structure 30 to fill a space of the accommodating structure 30, which has a height of 0.1 mm counting from the bottom. Then, $SiN_x$ of 0.5 μm is produced as the first inorganic thin film encapsulation layer 41 by CVD, so that the layer seals the first color rendering material 51 in the first space of the accommodating structure 30, and covers the light emitting unit 20. Polyethylene of 20 μm is manufactured as the first organic thin film encapsulation layer 42 by printing, so that the edge of the layer is within the range enclosed by the accommodating structure 30. A mixture of PHBB and glycerin is sprayed into the accommodating structure 30 as the second color rendering material 52 to completely fill the remaining space inside the accommodating structure 30. Thereafter, $SiN_x$ of 1 μm is manufactured as the second inorganic thin film encapsulation layer 43 to seal the second color rendering material 52 in the second space of the accommodating structure 30, and the layer also covers the light emitting unit 20. After completing all the encapsulation structures, cutting is performed by laser, to form a screen, which is then heated at 60° C. Next, the accommodating structure 30 is observed with a microscope, and if the accommodating structure 30 is getting darker (namely, there is a color change due to the color development reaction), there must be a crack in the first inorganic thin film 41, that is, in the line of defense that prevents the intrusion of moisture into the light emitting unit 20, which may be repaired or scrapped depending on the damage to avoid affecting the product quality.

Specific embodiments of a structure and a manufacturing method of an electroluminescent device according to another embodiment in the art will be described below in conjunction with FIGS. 2 and 4 to explain the inventive concept of the present disclosure in more detail. Those skilled in the art can understand that a second embodiment is provided only for further explanation of the present disclosure, and is not intended to limit the present disclosure.

Other preparation processes are the same as those of the first embodiment except for the accommodating structure 30. The accommodating structure may be two rows of trapezoidal retaining walls having a width of 0.1 mm and a height of 0.3 mm formed by photoresist, with an interval of 1 mm. After the encapsulation is completed in the same manner as that in the first embodiment, the accommodating structure 30 is observed with a microscope, and if the accommodating structure 30 is getting darker (namely, there is a color change due to the color development reaction), there must be a crack in the first inorganic thin film 41, that is, in the line of defense that prevents the intrusion of moisture into the light emitting unit 20, which may be repaired or scrapped depending on the damage to avoid affecting the product quality.

In the present disclosure, two types of color rendering materials 51, 52 that can produce a color development reaction are separated by an inorganic thin-film encapsulation layer that encapsulates a light emitting unit. If a crack caused by cutting extends to the inorganic thin-film encapsulation layer in the accommodating structure 30, the two kinds of color rendering materials will be mixed to produce a color development reaction, so that devices with cracks on the edge can be screened out in time by observing whether there is a color change in the accommodating structure 30, to avoid affecting the product quality. Furthermore, an edge inflection point of the accommodating structure 30 is smoothed, which can prevent the inorganic thin film from breaking in advance and thus affecting the observation result, so as to improve the accuracy of detection.

Preferred embodiments of the present disclosure disclosed above are provided only for the description of the present disclosure. Not all the details of the preferred embodiments are described in detail and the invention is not limited only to the described specific embodiments. Understandably, many modifications and changes can be made according to the contents of this specification. The embodiments are selected and specifically described in this specification in order to better explain the principle and practical application of the present disclosure, so that the present disclosure can be better understood and used by those skilled in the art. The present disclosure is only limited by the claims and its full scope and equivalents.

What is claimed is:

1. An electroluminescent device, comprising:
   a base substrate;
   a light emitting unit provided on the base substrate;
   a first accommodating structure surrounding the light emitting unit and provided on the base substrate;
   a first color rendering material filled in the first accommodating structure;
   a first inorganic thin film encapsulation layer covering the light emitting unit and the first color rendering material;
   a second accommodating structure provided on one side of the first inorganic thin film encapsulation layer distal to the first color rendering material;
   a second color rendering material filled in the second accommodating structure; and a second inorganic thin film encapsulation layer sealing the second color rendering material in the second accommodating structure;

wherein the first color rendering material and the second color rendering material are capable of producing a color development reaction after mixture.

2. The electroluminescent device according to claim 1, wherein an orthographic projection of the second accommodating structure on the base substrate overlaps an orthographic projection of the first accommodating structure on the base substrate.

3. The electroluminescent device according to claim 1, wherein the first accommodating structure is a groove disposed on the base substrate.

4. The electroluminescent device according to claim 1, wherein the first accommodating structure is formed by a retaining wall provided on the base substrate.

5. The electroluminescent device according to claim 2, wherein an edge inflection point of the first accommodating structure has a smooth surface.

6. The electroluminescent device according to claim 1, wherein one of the first color rendering material and the second color rendering material comprises a colorless dyestuff/leuco dye while the other of the first color rendering material and the second color rendering material comprises a chromogenic agent.

7. The electroluminescent device according to claim 6, wherein the colorless dyestuff/leuco dye is selected from one or more of crystal violet lactone, fluorane dyes, BLMB or spiropyran dye; and the chromogenic agent is selected from one or more of para-hydroxybenzoic acid and para-hydroxybenzoic acid esters, salicylic acid, 2,4-dihydroxybenzoic acid or aromatic sulfone.

8. The electroluminescent device according to claim 1, wherein the base substrate is made of a flexible material.

9. The electroluminescent device according to claim 3, wherein an edge inflection point of the first accommodating structure has a smooth surface.

10. The electroluminescent device according to claim 4, wherein an edge inflection point of the first accommodating structure has a smooth surface.

11. The electroluminescent device according to claim 2, wherein one of the first color rendering material and the second color rendering material comprises a colorless dyestuff/leuco dye while the other of the first color rendering material and the second color rendering material comprises a chromogenic agent.

12. The electroluminescent device according to claim 2, wherein the base substrate is made of a flexible material.

13. The electroluminescent device according claim 1, wherein the electroluminescent device is implemented in a display device.

* * * * *